United States Patent [19]

Münzel et al.

[11] Patent Number: 5,650,262
[45] Date of Patent: Jul. 22, 1997

[54] HIGH-RESOLUTION NEGATIVE PHOTORESIST WITH WIDE PROCESS LATITUDE

[76] Inventors: Norbert Münzel, Im Clausenfeld 3, 79423 Heitersheim; Reinhard Schulz, Am Pfarrgarten 5a, 79219 Staufen-Wettelbrunn; Heinz Holzwarth, St. Blasierweg 2, 79189 Bad Krozingen, all of Germany

[21] Appl. No.: 417,119

[22] Filed: Apr. 5, 1995

Related U.S. Application Data

[63] Continuation of Ser. No. 320,825, Oct. 7, 1994, abandoned, which is a continuation of Ser. No. 142,147, Oct. 28, 1993, abandoned.

[30] Foreign Application Priority Data

Oct. 29, 1992 [CH] Switzerland ............... 3369/92

[51] Int. Cl.$^6$ ........................................... G03F 7/004
[52] U.S. Cl. .................. 430/270.1; 430/905; 430/921
[58] Field of Search ......................... 430/191, 192, 430/193, 165, 270.1, 176, 905, 921

[56] References Cited

U.S. PATENT DOCUMENTS

| | | | |
|---|---|---|---|
| 3,515,552 | 6/1970 | Smith | 96/35.1 |
| 3,536,489 | 10/1970 | Smith | 96/28 |
| 3,689,572 | 9/1972 | Ruppert et al. | 260/610 B |
| 3,779,778 | 12/1973 | Smith et al. | 96/115 R |
| 4,058,400 | 11/1977 | Crivello | 96/86 |
| 4,058,401 | 11/1977 | Crivello | 96/115 R |
| 4,069,055 | 1/1978 | Crivello | 96/115 R |
| 4,371,605 | 2/1983 | Renner | 430/280 |
| 4,387,152 | 6/1983 | Stahlhofen | 430/191 |
| 4,537,725 | 8/1985 | Irving | 556/138 |
| 4,540,598 | 9/1985 | Renner et al. | 427/54.1 |
| 4,789,619 | 12/1988 | Ruckert et al. | 430/192 |
| 5,008,175 | 4/1991 | Hsieh et al. | 430/191 |
| 5,034,304 | 7/1991 | Feely | 430/191 |
| 5,085,972 | 2/1992 | Vogel | 430/270 |
| 5,112,719 | 5/1992 | Yamada et al. | 430/192 |
| 5,164,278 | 11/1992 | Brunsvold et al. | 430/176 |
| 5,183,722 | 2/1993 | Tsutsumi et al. | 430/191 |
| 5,208,133 | 5/1993 | Tsumori | 430/270 |
| 5,215,856 | 6/1993 | Jayaraman | 430/191 |
| 5,225,310 | 7/1993 | Stahlhofen et al. | 430/165 |
| 5,238,775 | 8/1993 | Kajita et al. | 430/192 |
| 5,256,522 | 10/1993 | Spak et al. | 430/325 |
| 5,286,330 | 2/1994 | Schulz et al. | 430/191 |

FOREIGN PATENT DOCUMENTS

| | | |
|---|---|---|
| 576136 | of 0000 | Belgium . |
| 1285686 | 7/1991 | Canada . |
| 0037152 | 10/1981 | European Pat. Off. . |
| 0050802 | 5/1982 | European Pat. Off. . |
| 0139609 | 5/1985 | European Pat. Off. . |
| 0164314 | 12/1985 | European Pat. Off. . |
| 0241423 | 10/1987 | European Pat. Off. . |
| 0295465 | 12/1988 | European Pat. Off. . |
| 0404499 | 12/1990 | European Pat. Off. . |
| 0435437 | 7/1991 | European Pat. Off. . |
| 0445058 | 9/1991 | European Pat. Off. . |
| 0530148 | 3/1993 | European Pat. Off. . |
| 4-251849 | 9/1992 | Japan . |
| 2120263 | 11/1983 | United Kingdom . |

OTHER PUBLICATIONS

Oie et al., Chemical Abstracts, vol. 116, No. 2 (1992), Abstract No. 13391s JP-A-03 200 254.

Osako et al., Chemical Abstracts, vol. 117, No. 10 (1992), Abstract No. 101054k JP-A-04 012 357.

Ota et al., Chemical Abstracts, vol. 118, No. 20 (1993), Abstract No. 202087x JP-A-04 274 242.

Tokutake et al., Chemical Abstracts, vol. 115, No. 26 (1991), Abstract No. 291208t JP-A-03 158 854.

Kawada et al., Chemical Abstracts, vol. 118, No. 18 (1993), Abstract No. 180076r JP-A-04 301 851.

Houben–Weyl, Methoden der organischen Chemie, 4th Edition, vol. VI/IC "Phenole/Tiel 2" Georg Thiane Verlag Stuttgart, Germany 1976 pp. 1022–1032.

Pappas, UV Curing: Science and Technology, vol. II, Technology Marketing Corp., Norwalk, Connecticut 1985, pp. 13–25.

Ullman's Encyclopaedia of Industrial Chemistry, 4th Edition, vol. 15 (1978) pp. 613–628.

*Primary Examiner*—John S. Chu
*Attorney, Agent, or Firm*—Wenderoth, Lind & Ponack

[57] ABSTRACT

The invention relates to a chemically amplified negative photoresist which can be developed in aqueous alkaline media, which contains a radiation-sensitive acid generator and a compound which reduces the solubility of the resist in aqueous alkaline solutions in the presence of acid, and a polyhydroxyl compound of the formula I $$Z{-}\left[\underset{R}{\underset{|}{\bigcirc}}{-}OH\right]_n \quad (I)$$

in which n is an integer between 2 and 6,

R is hydrogen, halogen, $C_1$–$C_4$alkoxy or $C_1$–$C_4$alkyl, and

Z is an n-valent radical which is unsubstituted or substituted by one or more substituents from the group consisting of hydroxyl, halogen and $C_1$–$C_4$alkoxy, and is selected from the group consisting of:
  a) aliphatic radicals having 1 to 12 carbon atoms,
  b) cycloaliphatic radicals having 5 to 20 carbon atoms,
  c) aromatic radicals having 6 to 20 carbon atoms and
  d) radicals having 7 to 30 carbon atoms which comprise at least two different structural units selected from aliphatic, cycloaliphatic or aromatic groups. The resists described make it possible to reduce the demands made on the focusing accuracy during imagewise exposure.

8 Claims, No Drawings

HIGH-RESOLUTION NEGATIVE PHOTORESIST WITH WIDE PROCESS LATITUDE

This application is a continuation of now abandoned application Ser. No. 08/320,825, filed Oct. 7, 1994, which is a continuation of a now abandoned application Ser. No. 08/142,147, filed Oct. 28, 1993.

The invention relates to a chemically amplified negative photoresist which can be developed in aqueous alkaline media, and to a process for the production of negative images using this resist.

Chemically amplified photoresists which can be developed in aqueous alkaline media are known. Negative photoresists of this type are described, for example, in EP-A-0 404 499 and generally exhibit increased resolution over conventional resists. They contain at least one radiation-sensitive acid generator, ie. chemical groups which form an acid on exposure to actinic radiation, and groups which, catalyzed by the acid formed, undergo a chemical reaction which reduces the solubility of the resist in the developer solution. The chemical reaction resulting in reduction in the solubility of the resist can be, for example, an acid-catalyzed crosslinking reaction between one or more components of the resist composition.

In addition to these principal components, the photoresists generally also contain other components which are intended to improve certain properties. For example, EP-A-0 445 058 describes a negative photoresist which contains triphenylsulfonium triflate as radiation-sensitive acid generator and an epoxy novolak resin as binder. The binder simultaneously forms the compound which, catalyzed by the acid formed on irradiation of the resist, cures, ie. undergoes a chemical reaction which reduces the solubility of the resist in a suitable developer. In addition, this resist also contains a polyhydroxyl compound, hydroquinone, in an amount of 2.5 per cent by weight in order to increase the radiation sensitivity.

The production of a resist coating structured in a certain way on a substrate is carried out by a widely used method in which a coherent coating of the resist composition applied to a substrate is first irradiated through a mask which only allows the radiation to penetrate to the coating in desired areas, so that the solubility of the resist coating drops in these areas, and the soluble parts of the coating are then dissolved out using a developer.

However, certain properties of the known negative resists are not satisfactory in all respects. Thus, continuing miniaturization, in particular in microelectronics, requires the resolution of ever smaller structures. For example, a resolution of structures between 0.5 and 0.6 µm is sufficient for the production of integrated 16 Mbit memory units, but the resolution capacity of the resist must be below 0.4 µm for the production of 64 Mbit memories. In addition, the known photoresists make excessive demands on the focusing accuracy during imagewise exposure, in particular if structures in the submicron or subsemimicron range are to be resolved.

The object is therefore to provide a novel negative photoresist which has such a composition that it enables improved resolution at the same time as increased focusing latitude.

The resist according to the invention is a chemically amplified negative photoresist which can be developed in aqueous alkaline media and contains a radiation-sensitive acid generator and a monomeric or polymeric compound which reduces the solubility of the resist in aqueous alkaline solutions in the presence of acid, and a polyhydroxyl compound, wherein the polyhydroxyl compound has the formula I

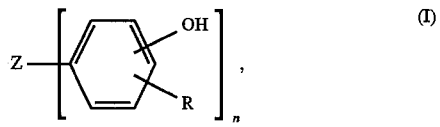

in which n is an integer between 2 and 6,

R is hydrogen, halogen, $C_1$–$C_4$alkoxy or $C_1$–$C_4$alkyl and

Z is an n-valent radical which is unsubstituted or substituted by one or more substituents from the group consisting of hydroxyl, halogen and $C_1$–$C_4$alkoxy, and is selected from the group consisting of:
  a) aliphatic radicals having 1 to 12 carbon atoms,
  b) cycloaliphatic radicals having 5 to 20 carbon atoms,
  c) aromatic radicals having 6 to 20 carbon atoms and
  d) radicals having 7 to 30 carbon atoms which comprise at least two different structural units selected from aliphatic, cycloaliphatic or aromatic groups.

If Z in the formula I is an aliphatic radical, it may be a straight-chain or branched aliphatic radical having a corresponding number of carbon atoms, for example an n-valent group derived from ethane, propane, isopropane, butane, tert-butane, pentane, hexane or octane. The aliphatic radicals Z are preferably straight-chain radicals having 2 to 4 carbon atoms.

Examples of cycloaliphatic radicals Z are n-valent radicals derived from cyclopentane, cyclohexane, cycloheptane or bicyclohexyl.

If Z in the formula I is an aromatic radical, it may be, for example, a radical derived from benzene, naphthalene, biphenyl or terphenyl by removal of n hydrogen atoms.

Examples of radicals having 7 to 30 carbon atoms which comprise at least two different structural units selected from aliphatic, cycloaliphatic or aromatic groups are n-valent groups derived from compounds such as ethylheptane, toluene, xylene, 2,2-diphenylpropane, biscyclohexylmethane, 2-cyclohexyl-2-phenylpropane or fluorene.

Polyhydroxyl compounds of the said type are known and are commercially available in many forms. They are obtainable, for example, in a manner known per se by the acid-catalyzed reaction of polyols, ketones and aldehydes or polyketones and polyaldehydes with phenols of a suitable structure. Examples of the preparation of these compounds are given, for example, in Houben-Weyl, "Methoden der organischen Chemie" [Methods of Organic Chemistry], 4th Edition, Volume VI/1c, "Phenole/Teil 2" [Phenols/Part 2], Georg Thieme Verlag Stuttgart, 1976, pp. 1022–1032, and in Belgian Patent 576 136 and U.S. Pat. No. 3 689 572.

In general, preference is given to the use of polyhydroxyl compounds of the formula I in which R is hydrogen, and to the use of compounds of the formula I in which n is either 3 or 4, and to the use of compounds having the structure

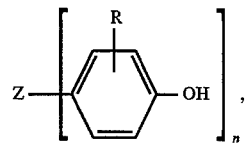

in which n, Z and R are as defined above, but R is preferably hydrogen. A combination of the abovementioned structural features is particularly preferred, in particular if the radical Z additionally conforms to one of the preferred forms mentioned below.

Preferred radicals Z are aliphatic radicals having 2 to 4 carbon atoms, and radicals built up from aromatic and aliphatic structural units, and preferably contain 7 to 20 carbon atoms. It is furthermore preferred if the radicals Z are unsubstituted, ie. contain no hydroxyl, halogen or $C_1-C_4$alkoxy substituents.

Examples of compounds of the formula I which are very particularly suitable according to the invention are 1,1,2,2-tetrakis(4-hydroxyphenyl)ethane, 1,2,2,3-tetrakis(4-hydroxyphenyl)propane, 1,3,3,5-tetrakis(4-hydroxyphenyl) pentane and in particular the compound of the formula II

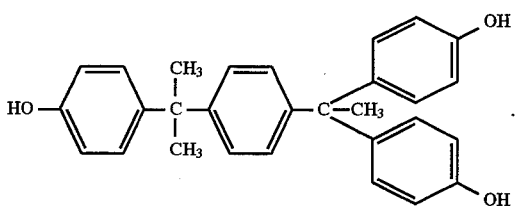

(II)

The negative resists according to the invention generally contain the polyhydroxyl compounds of the formula I in an amount of at least 5 per cent by weight, based on the total solids content of the resist. The upper limit is expediently about 30 per cent by weight. A content of from 10 to 20 per cent by weight is very highly suitable.

The choice of radiation-sensitive acid generator is not crucial in the present invention, and it is therefore generally possible to employ any compounds known for this purpose. The person skilled in the art will make the choice, for example, on the basis of the radiation with which he would like to cure the resist.

Radiation-sensitive acid generators which are suitable for the invention include, for example, halogen compounds which form hydrohalic acid on irradiation. Examples of compounds of this type are described in U.S. Pat. Nos. 3,515,552, 3,536,489, 3,779,778.

Other radiation-sensitive components of the negative resist composition according to the invention are onium compounds, such as iodonium or sulfonium salts. Such compounds are described in "UV-Curing, Science and Technology", in particular p. 13 ff. (editor: S. P. Pappas, Technology Marketing Corp., 642 Westover Road, Stanford, Conn., USA, 1985) and form the subject-matter of many patent specifications, for example U.S. Pat. Nos. 4,058,400, 4,058,401 and 4,069,055.

It is also possible to employ diaryliodosyl salts. Such compounds are described, for example, in EP-A-106 797.

It is furthermore possible to use sulfoxonium salts as the radiation-sensitive compounds. Aliphatic sulfoxonium salts which absorb in the deep UV region are described, for example, in EP-A-0 164 314.

A further group of suitable radiation-sensitive acid generators comprises metallocene salts, which are described, inter alia, in Canadian Patent No. 1,285,686.

It is furthermore possible to employ compounds which liberate sulfonic acids on exposure to actinic radiation. Examples of such compounds are described in GB-A-2 120 263, EP-A-0 037 152 and U.S. Pat. No. 4,371,605.

These compounds also include oxime sulfonate compounds, as described, for example, in EP-A-0 139 609 and EP-A-0 241 423. Specific photoinitiators of this type are the oxime sulfonates of the formula III

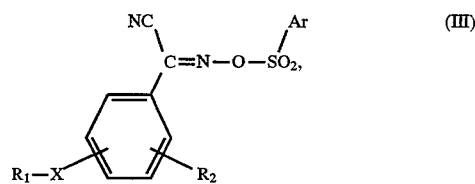

in which

Ar is an unsubstituted aryl group or an aryl group which has one or more chlorine, bromine, hydroxyl, $C_1-C_4$alkyl, $C_1-C_4$perfluoroalkyl or $C_1-C_4$alkoxy substituents, X is an oxygen or sulfur atom, $R_1$ is hydrogen, $C_1-C_4$alkyl or a phenyl group which is unsubstituted or substituted by chlorine, bromine, $C_1-C_4$alkyl or $C_1-C_4$alkoxy substituents, and $R_2$ is hydrogen or $C_1-C_4$alkyl. In this formula, Ar is preferably an aryl group of the formula

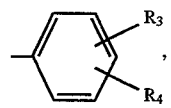

X is an oxygen atom, $R_1$ is a $C_1-C_4$alkyl or phenyl radical, and $R_2$, $R_3$ and R4, independently of one another, are hydrogen, chlorine or methyl. The use of these photoinitiators, for example α-(4-toluenesulfonyloxyimino)-4-methoxybenzyl cyanide, is very highly suitable for exposure using radiation from the region of the mercury I line (wavelength 365 nm).

Preference is given to photo-induced acid formers which liberate sulfonic acids or halogen acids on irradiation, in particular iminosulfonates. The content of radiation-sensitive acid generators in the resists according to the invention should be from about 0.1 to 20 per cent by weight, based on the total solids content of the resist, large variations being possible due to the many suitable types of acid generators.

Examples of suitable compounds which reduce the solubility of the resist in aqueous alkaline solution in the presence of the acid formed on irradiation of the acid generator are known acid-curable resins, for example acrylic, polyester, alkyd, melamine, urea, epoxy and phenolic resins or mixtures thereof. Acid-curable resins like these are generally known and are described, for example, in Ullmann's Encyclopädie der technischen Chemie [Ullmann's Encyclopaedia of Industrial Chemistry] 4th Edn., Vol. 15 (1978), pp. 613–628.

Particularly preferred acid-curable resins (crosslinking agents) are amino resins, for example unetherified or etherified melamine, urea, guanidine or biuret resins, in particular methylated melamine resins or butylated melamine resins, corresponding glycolurils and urones. Resins here are taken to mean both conventional technical-grade mixtures, which generally also include oligomers, and pure and highly pure defined compounds. Hexamethoxymethylmelamine (formula IV) and tetramethoxymethylglycoluril (formula V) and N,N'-dimethoxymethylurone (formula VI) are the most preferred acid-curable resins;

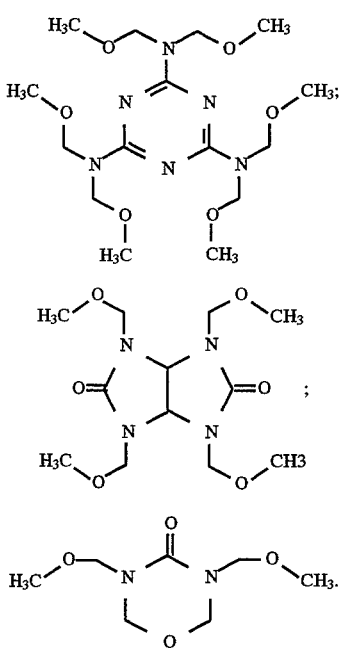

The proportion of this component can vary within broad limits. If an additional film-forming polymeric binder is present, this proportion is generally from 2 to 30 per cent by weight, based on the solids content of the resist.

An additional film-forming polymeric binder is necessary at least in cases where the acid-curable compound cannot itself function as binder for the resist composition. Particularly suitable materials here are alkali-soluble phenolic resins, for example novolaks, derived from an aldehyde, for example acetaldehyde or furfuraldehyde, but in particular from formaldehyde, and a phenol, for example unsubstituted phenol, mono- or di-chlorine-substituted phenol, such as p-chlorophenol, mono- or di-$C_1$–$C_9$alkyl-substituted phenol, such as o-, m- or p-cresol, the various xylenols, p-tert-butylphenol, p-nonylphenol, p-phenylphenol, resorcinol, bis (4-hydroxyphenyl)methane or 2,2-bis(4-hydroxyphenyl) propane. Also suitable are homopolymers and copolymers based on ethylenically unsaturated phenols, for example homopolymers of vinyl- and 1-propenyl-substituted phenols, such as p-vinylphenol and p-(1-propenyl)phenol, or copolymers of these phenols with one or more ethylenically unsaturated materials, for example styrenes. The amount of binder is generally between 30 and 90 per cent by weight or preferably between 40 and 80 per cent by weight, based on the solids content of the resist.

Of course, it is generally also possible to replace individual substances by mixtures of a plurality of representatives of the individual components described above.

A specific embodiment of the negative resist according to the invention comprises from 40 to 87 per cent by weight, in particular from 52 to 77 per cent by weight, of a phenolic resin as binder, preferably of a novolak or polyvinylphenol, from 5 to 25 per cent by weight, in particular from 5 to 20 per cent by weight, of a substance selected from hexamethoxymethylmelamine (formula IV), tetramethoxymethylglycoluril (formula V) and N,N'-dimethoxymethylurone (formula VI), either in highly pure or technical-grade form, from 0.1 to 10 per cent by weight, in particular from 1 to 10 per cent by weight, of a compound which forms sulfonic acids or halogen acids on irradiation, and from 5 to 25 per cent by weight, in particular from 10 to 25 per cent by weight, of a polyhydroxyl compound from the group consisting of 1,1,2,2-tetrakis(4-hydroxyphenyl)ethane; 1,2,2,3-tetrakis(4-hydroxyphenyl)propane, 1,3,3,5-tetrakis(4-hydroxyphenyl)pentane and the compound of the formula II already shown above. An example of a highly suitable resist would comprise from 60 to 75 per cent by weight of novolak resin, for example an m-cresol or m/p-cresol novolak, from 7.5 to 17.5 per cent by weight of hexamethoxymethylmelamine, from 12.5 to 17.5 per cent by weight of the polyhydroxyl compound of the above formula III and from 0.5 to 5 per cent by weight of α-(4-toluenesulfonyloxyimino)-4-methoxybenzyl cyanide as photo-induced acid generator.

In addition to the said constituents, the photoresist compositions according to the invention may also contain one or more additives conventional for negative resists in the amounts customary to a person skilled in the art, for example flow-control agents, wetting agents, adhesives, thixotropic agents, dyes, pigments, fillers, solubility accelerators, sensitizers, etc.

The present invention also relates to a process for producing images which comprises the following steps:

1.) production of a coating comprising one of the photoresists described herein on a substrate;
2.) imagewise exposure of the coated substrate by the projection exposure method; if desired warming, and
3.) development with the aid of an aqueous alkaline developer.

For application, the compositions must generally also contain a solvent. Examples of suitable solvents are ethyl lactate, 3-methoxymethyl propionate, 3-ethoxyethyl propionate, ethyl pyruvate, 2-heptanone, diethyl glycol dimethyl ether, cyclopentanone, cyclohexanone, γ-butyrolactone, ethyl methyl ketone, 2-ethoxyethanol, 2-ethoxyethyl acetate and in particular 1-methoxy-2-propyl acetate. The solvents may also be a mixture, for example of two or more of said solvents. The choice of solvent and concentration depends, for example, on the type of composition and on the coating method.

The solution is applied evenly to a substrate by known coating methods, for example by spin-coating, dip-coating, knife coating, curtain coating, brushing, spraying and reverse-roll coating. It is also possible to apply the photosensitive layer to a temporary, flexible support and then to coat the final substrate by layer transfer (lamination).

The application rate (coating thickness) and the type of substrate (layer carrier) depend on the desired application area. The layer thickness can in principle be in the range from about 0.1 µm to more than 100 µm.

Possible areas of application of the composition according to the invention are as photoresists for electronics, the production of printing plates, such as offset printing plates or screen-printing plates, in chemical milling and in particular as microresists in the production of integrated circuits. The layer supports and processing conditions are correspondingly various.

In the use as microresists for integrated and highly integrated circuits, which is preferred, the layer thicknesses are generally between 0.1 and 10 µm, preferably between 0.5 and 5 µm, in particular between 0.5 and 1.5 µm.

The compositions according to the invention are outstandingly suitable as coating compositions for substrates of all types, including wood, textiles, paper, ceramic, glass, plastics, such as polyester, for example polyethylene terephthalate, polyolefins or cellulose acetate, in particular in the form of films, but in particular for the coating of metals, such as Ni, Fe, Zn, Mg, Co or in particular Cu or Al and of Si, silicon oxides or nitrides, or other substrates which are conventional in the semiconductor industry, to which an image is to be applied by imagewise exposure.

After the coating, the solvent is generally removed by warming, giving a layer of the photoresist on the support. The drying temperature must of course be below the temperature at which certain components of the resist could cure thermally. For drying, the temperatures should in general not exceed from 80 to 130° C.

The resist coating is then exposed imagewise through a photomask containing a predefined pattern.

The photosensitivity of the negative resists according to the invention extends, depending on which radiation-sensitive acid generator is employed, from the UV region (about 200 nm) to about 600 nm and thus covers a very wide range, so that as light sources per se a large number of the most varying types can be used. Both point light sources and sheet-like emitters (lamp carpets) are suitable. Examples are carbon arc lamps, xenon arc lamps, mercury vapour lamps, for example medium- and high-pressure mercury lamps, if desired doped with metal halides (metal-halogen lamps), fluorescent lamps, argon incandescent lamps, electronic flash lamps and photographic flood lamps. The distance between the lamp and the image material according to the invention can vary depending on the application and lamp type and strength, for example between 2 cm and 150 cm.

If desired, sensitizers can also be added to the photoresists in order to increase the spectral sensitivity in a certain wavelength region. These sensitizers include, for example, Michler's ketone, benzophenones, phenothiazines, thioxanthones and aromatic hydrocarbons, such as anthracene, substituted anthracenes, pyrene and perylene.

Before development, a certain time is generally necessary to allow the components of the resist composition to react. In order to accelerate this reaction and thus the formation of a sufficiently differentiated solubility between the exposed and unexposed areas of the resist coating in the developer, the coating is preferably warmed before development. The warming can also already have been carried out during exposure or can begin during exposure. Preferred temperatures are between 60° and 150° C. The duration depends on the warming method and can, if necessary, easily be optimized by the person skilled in the art with the aid of a few routine experiments. It is generally between a few seconds and several minutes. For example, from 10 to 300 seconds are highly suitable if a hotplate is used, and from 1 to 30 minutes if a convection oven is used.

The layer is then developed, the non-exposed, more soluble parts of the coating being removed. Gentle agitation of the workpiece, gentle brushing of the coating in the developer bath or spray development may accelerate this process step. For development, conventional aqueous alkaline developers of resist technology, for example, can be used. Such developers contain, for example, sodium hydroxide, potassium hydroxide, the corresponding carbonates, bicarbonates, silicates or metasilicates, but preferably metal-free bases, such as ammonia or amines, for example ethylamine, n-propylamine, diethylamine, di-n-propylamine, triethylamine, methyldiethylamine, alkanolamines, for example dimethylethanolamine, or triethanolamine, or quaternary ammonium hydroxides, for example tetramethylammonium hydroxide or tetraethylammonium hydroxide. The developer solutions are generally up to 0.5N, but are generally diluted in a suitable manner before use. For example, solutions having a normality of from about 0.1 to 0.3 are highly suitable for use. The choice of the particular developer depends on the type of photoresist, in particular on the nature of the binder used or of the photolysis products formed. The aqueous developer solutions may also, if desired, contain relatively small amounts of wetting agents and/or organic solvents. Typical organic solvents which can be added to the developer liquids are, for example, cyclohexanone, 2-ethoxyethanol, toluene, acetone, isopropanol and mixtures of two or more of these solvents. A typical aqueous/organic developer system is based on Butylcellosolve®/water.

EXAMPLE 1

A first resist (resist 1) is prepared from 22.1 g of polyvinylphenol (PHM-C, manufacturer Maruzen Chemicals), 8.9 g of melamine resin (Cymel®303, manufacturer Cyanamid) and 2.6 g of tribromomethyl phenyl sulfone (manufacturer Sumitomo), and 0.5 g of phenothiazine as sensitizer and 66 g of diglyme (diethylene glycol dimethyl ether) as solvent.

A further three resists (2,3 and 4) are prepared, in each case from 18.7 g of polyvinyl-phenol (PHM-C), 8.9 g of melamine resin Cymel®303, 2.6 g of tribromomethyl phenyl sulfone, 0.5 g of phenothiazine, 66 g of diglyme and in the case of resist 2 in addition 3.4 g of the compound of the formula II (TRISP-PA, manufacturer Mitsui Petrochemicals), in the case of resist 3 in addition 3.4 g of 1,2,2,3-tetrakis-(4-hydroxyphenyl)propane and in the case of resist 4 in addition 3.4 g of 1,1,2,2-tetrakis(4-hydroxyphenyl)ethane.

After microfiltration (0.2 µm), the resist solutions are in each case spin-coated onto a silicon wafer in such a way that a resist film with a thickness of 1.05 µm is obtained after drying for 60 seconds at 100° C. on a hotplate. Exposure of the wafers is carried out by means of radiation having a wavelength of 365 nm using a 5:1 projection exposure unit (ASM L PAS 5000/50 Stepper, NA 0.48) in steps, where either the exposure dose is changed by 10 mJ/cm$^2$ from one step to the next or the system is defocused by 0.3 µm compared with the ideal focusing and the exposure dose is varied in total between 20 and 220 mJ/cm$^2$ and the defocusing between +1.5 µm and −1.5 µm compared with the ideal setting. The resist film is then heated for 60 seconds at 110° C. on a hotplate and subsequently developed for 90 seconds in aqueous 2.38% tetramethylammonium hydroxide (TMAH) solution.

The maximum resolution for the most accurate focusing and the focusing latitude, ie. the total range in µm by which the focusing can vary compared with the ideal setting without a deviation of the resist structures by more than 0.05 µm (±10%) compared with their nominal dimensions occurring, is determined by electron microscopy. The values are shown in Table 1.

TABLE 1

| Resist | Focusing latitude [µm] | Maximum resolution, l/s* [µm] |
|---|---|---|
| 1 | 1.5–1.8 | 0.40(zero comparison) |
| 2 | >2.1 | 0.35 |
| 3 | >2.1 | 0.35 |
| 4 | >2.1 | 0.35 |

*lines and spaces

It can be seen that the negative resists according to the invention (resists 2, 3 and 4) have a focusing latitude which is greater by more than 15% than resist 1, which does not contain a compound of the formula I. In addition, the maximum resolution and the sensitivity are increased.

EXAMPLE 2

Resist 5 is prepared by dissolving 4.7 g of m-cresol novolak, 1.2 g of hexa(methoxymethyl)melamine and 0.15 g of α-(4-toluenesulfonyloxyimino)-4-methoxybenzyl cyanide (prepared by the procedure published in EP-A-0 241 423) in 14 g of diglyme. Resist solutions 6, 7 and 8 are obtained analogously from 1.2 g of hexa(methoxymethyl) melamine and 0.15 g of α-(4-toluenesulfonyloxyimino)-4-methoxybenzyl cyanide and m-cresol novolak (4.4 g in the case of resist 6, 4.2 g in the case of resist 7 and 4.0 g in the case of resist 8) with addition of various amounts of the compound of the above formula II (0.3 g corresponding to 5 per cent by weight of the total solids content in the case of resist 6, 0.6 g, corresponding to 10 per cent by weight of the total solids content in the case of resist 7, and 0.9 g, corresponding to 15 per cent by weight of the total solids content in the case of resist 8) and 14 g of diglyme.

The resist solutions are applied and exposed as described in Example 1. After heating for 60 seconds at 110° C. on a hotplate, the resists are developed by means of 0.262N TMAH solution.

Table 2 shows the results for maximum resolution and focusing latitude determined by electron microscopy.

TABLE 2

| Resist | Focusing latitude [μm] | Maximum resolution, l/s* [μm] |
|---|---|---|
| 5 | <1.5 | 0.40(zero comparison) |
| 6 | 1.5 | 0.40 |
| 7 | 1.8 | 0.35 |
| 8 | >1.8 | 0.35 |

*lines and spaces

Zero comparison without using a compound of the formula (I).

EXAMPLE 3

Resist 9 is prepared from 9.7 g of m-cresol novolak, 2.5 g of hexa(methoxymethyl)melamine, 0.2 g of a radiation-sensitive acid generator of the formula

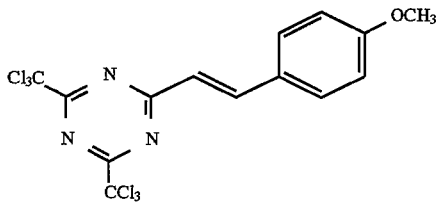

and 27.6 g of diglyme, and resist 10 is prepared from 8.5 g of m-cresol novolak, 2.5 g of hexa(methoxymethyl) melamine, 0.2 g of the acid generator from resist 9, 27.6 g of diglyme and 1.2 g of the compound of the above formula II.

After microfiltration (0.2 μm), the two resist solutions are in each case spin-coated onto a silicon wafer in such a way that a resist film with a thickness of 1.5 μm is obtained after drying for 60 seconds at 100° C. on the hotplate. Exposure of the wafer is carried out by means of a GCA-6400 (NA 0.38) G-line stepper (wavelength 436 nm) in steps, where either the exposure dose is changed by 5 mJ/cm² from one step to the next or the system is defocused by 0.3 μm compared with the ideal focusing and the exposure dose is varied in total between 20 and 160 mJ/cm² and the defocusing between +3 μm and −3 μm relative to the ideal setting. The resist film is then heated for 60 seconds at 105° C. on the hotplate and subsequently developed for 90 seconds in aqueous 2.38% tetramethylammonium hydroxide (TMAH) solution.

The maximum resolution for the most accurate focusing and the focusing latitude, ie. the total range in μm by which the focusing can vary compared with the ideal setting without a deviation of the resist structures by more than ±10% compared with their nominal dimensions occurring, is determined by electron microscopy.

TABLE 3

| Resist | Focusing latitude [μm] | Maximum resolution, l/s* [μm] |
|---|---|---|
| 9 | 2.4 | 0.85(zero comparison) |
| 10 | 3.0 | 0.70 |

*lines and spaces

In addition to the focusing latitude, the maximum resolution here is also about 20% better.

What is claimed is:

1. A chemically amplified negative photoresist for aqueous alkaline developers which contains (1) an alkali-soluble phenolic resin in an amount of between 30 and 90 percent by weight, based on the solids content of the photoresist, (2) a radiation-sensitive acid generator, (3) a compound which reduces the solubility of the resist in aqueous alkaline solutions in the presence of acid, and (4) a polyhydroxyl compound of formula I

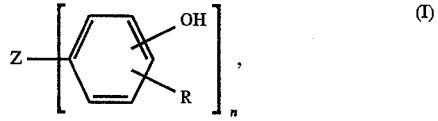

in which n is an integer between 2 and 6,

R is hydrogen, halogen, $C_1$–$C_4$alkoxy or $C_1$–$C_4$ alkyl and

Z is an N-valent radical which is unsubstituted or substituted by one or more substituents from the group consisting of hydroxyl, halogen and $C_1$–$C_4$alkoxy, and is selected from the group consisting of a) aliphatic radicals having 1 to 12 carbon atoms, b) cycloaliphatic radicals having 5 to 20 carbon atoms, c) aromatic radicals having 6 to 20 carbon atoms, and d) radicals having 7 to 30 carbon atoms which comprise at least two different structural units selected from aliphatic, cycloaliphatic or aromatic groups, each component of the photoresist being present in an amount such that the resist is soluble in aqueous alkaline developers and becomes practically insoluble in aqueous alkaline developers after exposure to a radiation having a wavelength of from 200 to 600 nm.

2. A photoresist according to claim 1, wherein n in the formula (I) is either 3 or 4.

3. A photoresist according to claim 1, wherein R in the formula (I) is hydrogen.

4. A photoresist according to claim 1, wherein the compound of the formula (I) has the following structure:

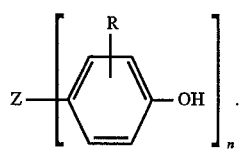

5. A photoresist according to claim 4, which contains a compound of the formula II

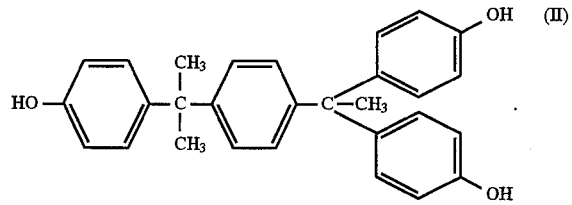

6. A photoresist according to claim 1, which contains from 5 to 30 per cent by weight of the compound of the formula (I), based on the solids content of the resist.

7. A photoresist according to claim 6, which comprises from 40 to 87 per cent by weight of a phenolic resin as binder, from 5 to 25 per cent by weight of a crosslinking agent selected from N-methoxymethylmelamine and tetramethoxymethylglycoluril and N,N'-dimethoxymethylurone in highly pure or technical-grade form, from 0.1 to 10 per cent by weight of a compound which forms sulfonic acids or halogen acids on irradiation, and from 5 to 25 per cent by weight of a polyhydroxyl compound from the group consisting of 1,1,2,2-tetrakis(4-hydroxyphenyl)ethane, 1,2,2,3-tetrakis(4-hydroxyphenyl)propane, 1,3,3,5-tetrakis(4-hydroxyphenyl)pentane and the compound of the formula II

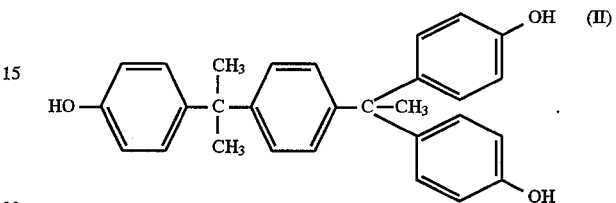

8. A photoresist according to claim 7 wherein the phenolic resin is a novolak or polyvinylphenol.

* * * * *